United States Patent
Hsieh et al.

(10) Patent No.: US 11,053,584 B2
(45) Date of Patent: Jul. 6, 2021

(54) SYSTEM AND METHOD FOR SUPPLYING A PRECURSOR FOR AN ATOMIC LAYER DEPOSITION (ALD) PROCESS

(71) Applicant: Taiwan Semiconductor Manufacturing Company Limited, Hsinchu (TW)

(72) Inventors: Bor-Chiuan Hsieh, Taoyuan County (TW); Chien-Kuo Huang, Hsinchu (TW); Tai-Chun Huang, Hsinchu (TW); Kuang-Yuan Hsu, Taichung (TW); Tze-Liang Lee, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 91 days.

(21) Appl. No.: 16/600,648

(22) Filed: Oct. 14, 2019

(65) Prior Publication Data

US 2020/0040450 A1 Feb. 6, 2020

Related U.S. Application Data

(62) Division of application No. 14/071,784, filed on Nov. 5, 2013, now Pat. No. 10,443,127.

(51) Int. Cl.
*C23C 16/50* (2006.01)
*C23C 16/40* (2006.01)
(Continued)

(52) U.S. Cl.
CPC ...... *C23C 16/4402* (2013.01); *C23C 16/4412* (2013.01); *C23C 16/45525* (2013.01); *C23C 16/45593* (2013.01); *C23C 16/52* (2013.01)

(58) Field of Classification Search
CPC .......... H01J 37/32834; H01J 37/32844; C23C 16/4402; C23C 16/45593; C23C 16/45525; C23C 16/52; C23C 16/4412
(Continued)

(56) References Cited

U.S. PATENT DOCUMENTS

| 4,468,283 | A | * | 8/1984 | Ahmed | ............. C23C 16/45504 |
| | | | | | 117/102 |
| 5,401,316 | A | * | 3/1995 | Shiraishi | ............ C23C 16/4412 |
| | | | | | 118/689 |

(Continued)

OTHER PUBLICATIONS

Chinese Office Action; Application No. 201410047902.0; dated Jul. 21, 2016.
(Continued)

*Primary Examiner* — Rudy Zervigon
(74) *Attorney, Agent, or Firm* — Jones Day

(57) ABSTRACT

Systems and methods for supplying a precursor material for an atomic layer deposition (ALD) process are provided. A gas supply provides one or more precursor materials to a deposition chamber. The deposition chamber receives the one or more precursor materials via an input line. A gas circulation system is coupled to an output line of the deposition chamber. The gas circulation system includes a gas composition detection system configured to produce an output signal indicating a composition of a gas exiting the deposition chamber through the output line. The gas circulation system also includes a circulation line configured to transport the gas exiting the deposition chamber to the input line. A controller is coupled to the gas supply. The controller controls the providing of the one or more precursor materials by the gas supply based on the output signal of the gas composition detection system.

20 Claims, 4 Drawing Sheets

(51) Int. Cl.
   *H01J 37/32*     (2006.01)
   *C23C 16/44*    (2006.01)
   *C23C 16/52*    (2006.01)
   *C23C 16/455*   (2006.01)

(58) Field of Classification Search
   USPC ............ 156/345.29; 118/715, 696, 697, 708; 427/248.1
   See application file for complete search history.

(56) References Cited

U.S. PATENT DOCUMENTS

| | | | | |
|---|---|---|---|---|
| 5,565,038 A * | 10/1996 | Ashley | ................ | B08B 3/08 134/2 |
| 5,944,049 A * | 8/1999 | Beyer | ................ | F04B 49/08 137/487.5 |
| 5,958,138 A * | 9/1999 | Tomita | ................ | B01D 8/00 118/715 |
| 6,217,633 B1 * | 4/2001 | Ohmi | ................ | B01J 3/00 95/127 |
| 6,224,677 B1 * | 5/2001 | Nozawa | ................ | B01D 8/00 118/715 |
| 6,365,229 B1 * | 4/2002 | Robbins | ................ | B05D 1/60 118/715 |
| 6,527,884 B1 * | 3/2003 | Takakuwa | ................ | C21D 1/76 148/634 |
| 6,605,134 B2 * | 8/2003 | Ishihara | ................ | B01D 53/22 95/45 |
| 6,673,323 B1 * | 1/2004 | Bhatnagar | ................ | B01D 53/34 423/210 |
| 6,701,202 B2 * | 3/2004 | Nakano | ................ | C23C 16/52 700/108 |
| 6,716,477 B1 * | 4/2004 | Komiyama | ................ | C23C 16/44 427/8 |
| 6,782,907 B2 * | 8/2004 | Kawasaki | ................ | C23C 16/4412 118/715 |
| 6,884,738 B2 * | 4/2005 | Asai | ................ | C23C 16/405 438/758 |
| 6,942,891 B2 * | 9/2005 | Komiyama | ................ | C23C 16/44 427/8 |
| 7,258,725 B2 * | 8/2007 | Ohmi | ................ | B01D 53/68 95/41 |
| 8,026,159 B2 * | 9/2011 | Horii | ................ | C23C 16/45525 438/500 |
| 8,298,625 B2 * | 10/2012 | Stimson | ................ | H01J 37/32091 427/569 |
| 8,343,592 B2 * | 1/2013 | Kudela | ................ | C23C 16/513 427/569 |
| 8,344,627 B1 * | 1/2013 | Hooke | ................ | H01J 37/32348 315/111.21 |
| 8,382,071 B2 | 2/2013 | Hattori | | |
| 8,415,237 B2 * | 4/2013 | Horii | ................ | C23C 16/409 438/500 |
| 8,591,634 B2 * | 11/2013 | Winchester | ................ | B01D 53/04 96/127 |
| 8,657,958 B2 * | 2/2014 | Revankar | ................ | C01B 3/506 118/715 |
| 2001/0050096 A1 * | 12/2001 | Costantini | ................ | H01L 21/67034 134/58 R |
| 2002/0022087 A1 * | 2/2002 | Satake | ................ | C23C 16/45561 427/255.28 |
| 2002/0192369 A1 * | 12/2002 | Morimoto | ................ | C23C 16/14 427/248.1 |
| 2003/0007917 A1 * | 1/2003 | Ohmi | ................ | C01B 7/0712 423/240 R |
| 2003/0036272 A1 * | 2/2003 | Shamouilian | ....... | H01J 37/3244 438/691 |
| 2003/0038929 A1 * | 2/2003 | Tokuda | ................ | G03F 7/70933 355/30 |
| 2003/0168001 A1 | 9/2003 | Sneh | | |
| 2003/0181060 A1 * | 9/2003 | Asai | ................ | C23C 16/45565 438/758 |
| 2004/0002170 A1 * | 1/2004 | Shimizu | ............... | C23C 16/4405 438/5 |
| 2004/0043544 A1 * | 3/2004 | Asai | ........................ | C23C 16/40 438/149 |
| 2004/0157347 A1 * | 8/2004 | Komiyama | ............. | C23C 16/52 438/8 |
| 2004/0250775 A1 * | 12/2004 | Sakai | .................. | C23C 16/4412 118/728 |
| 2004/0255854 A1 * | 12/2004 | Sakai | ................ | C23C 16/45593 118/715 |
| 2005/0109419 A1 * | 5/2005 | Ohmi | ....................... | B01D 53/68 141/4 |
| 2005/0145333 A1 * | 7/2005 | Kannan | .................. | C23C 16/52 156/345.24 |
| 2005/0255714 A1 | 11/2005 | Iyer et al. | | |
| 2006/0033893 A1 * | 2/2006 | Nakano | ............... | G03F 7/70933 355/30 |
| 2006/0102282 A1 * | 5/2006 | Scott | ........................ | B08B 9/00 156/345.18 |
| 2008/0081130 A1 * | 4/2008 | Farnia | ................. | C23C 16/4412 427/577 |
| 2008/0251104 A1 * | 10/2008 | Chen | ................. | H01L 21/67253 134/18 |
| 2009/0017206 A1 * | 1/2009 | Clark | ................ | C23C 16/45593 427/248.1 |
| 2009/0061648 A1 * | 3/2009 | Horii | ................ | C23C 16/45561 438/778 |
| 2009/0074646 A1 * | 3/2009 | Sasagawa | ......... | H01L 21/31116 423/325 |
| 2009/0101069 A1 * | 4/2009 | Anwar | ................... | C23C 16/505 118/723 E |
| 2009/0159423 A1 * | 6/2009 | Kudela | ............. | H01L 21/02104 204/157.44 |
| 2009/0238972 A1 * | 9/2009 | Clark | .................. | C23C 16/4402 427/255.28 |
| 2009/0246105 A1 * | 10/2009 | Clark | ...................... | C23C 14/56 423/219 |
| 2011/0005681 A1 * | 1/2011 | Savas | ................. | H01J 37/32036 156/345.33 |
| 2011/0300695 A1 * | 12/2011 | Horii | ..................... | C23C 16/409 438/507 |
| 2012/0031266 A1 * | 2/2012 | Amikura | ................ | B01D 53/30 95/19 |
| 2012/0064245 A1 | 3/2012 | Coutu et al. | | |
| 2012/0186604 A1 * | 7/2012 | Takano | ................ | C23C 16/4405 134/1.2 |
| 2013/0093048 A1 | 4/2013 | Chang et al. | | |
| 2013/0186859 A1 * | 7/2013 | Kudela | ................ | C23C 16/513 216/71 |
| 2014/0290859 A1 * | 10/2014 | Kobayashi | .......... | H01L 21/6708 156/345.15 |
| 2015/0125591 A1 * | 5/2015 | Hsieh | ................ | C23C 16/45525 427/8 |
| 2015/0196870 A1 * | 7/2015 | Albright | ............. | C01B 23/0042 95/45 |

OTHER PUBLICATIONS

Elam, J.W., Groner, M.D., George, S.M.; Viscous Flow Reactor with Quartz Crystal Microbalance for Thin Film Growth by Atomic Layer Deposition; Review of Scientific Instruments, 73(8); pp. 2981-2987; 2002.

Groner, M.D., Elam, J.W., Fabreguette, F.H., George, S.M.; Electrical Characterization of Thin Al2O3 Films Grown by Atomic Layer Deposition on Silicon and Various Metal Substrates; Thin Solid Films, 413; pp. 186-197; 2002.

MKS; Atomic Layer Deposition; 2011.

* cited by examiner

SYSTEM AND METHOD FOR SUPPLYING A PRECURSOR FOR AN ATOMIC LAYER DEPOSITION (ALD) PROCESS

CROSS-REFERENCE TO RELATED APPLICATION

This application is a divisional application under 35 U.S.C. § 121 of U.S. patent application Ser. No. 14/071,784, filed on Nov. 5, 2013, the contents of which are incorporated herein by reference in its entirety.

TECHNICAL FIELD

The technology described in this disclosure relates generally to an atomic layer deposition (ALD) process and more particularly to systems and methods for reducing an amount of precursor material used in an ALD process.

BACKGROUND

Semiconductor processing in the fabrication of integrated circuitry may involve the deposition of layers on semiconductor substrates. Exemplary processes for performing such depositions may include chemical vapor deposition (CVD) processes and atomic layer deposition (ALD) processes, among others. The CVD and ALD processes may be conducted within a deposition chamber that retains one or more substrates upon a wafer holder. In an ALD process, one or more precursor gases may be provided to a showerhead within the deposition chamber, where the showerhead may provide the one or more precursor gases uniformly over an outer surface of the substrate. The one or more precursor gases may react or otherwise cause a layer to be deposited substantially over the substrate. Plasma enhancement may or may not be utilized in the ALD process. If plasma enhancement is utilized, a plasma may be generated and maintained either within the chamber or remote from the chamber.

SUMMARY

The present disclosure is directed to systems and methods for supplying a precursor material for an atomic layer deposition (ALD) process. A system for supplying a precursor material for an ALD process includes a gas supply for providing one or more precursor materials to a deposition chamber. The deposition chamber receives the one or more precursor materials via an input line of the deposition chamber. The system also includes a gas circulation system coupled to an output line of the deposition chamber. The gas circulation system includes a gas composition detection system configured to produce an output signal indicating a composition of a gas exiting the deposition chamber through the output line. The gas circulation system also includes a circulation line configured to transport the gas exiting the deposition chamber to the input line. The circulation line causes the gas exiting the deposition chamber to be transported back into the deposition chamber. The system further includes a controller coupled to the gas supply. The controller controls the providing of the one or more precursor materials by the gas supply based on the output signal of the gas composition detection system.

In another example, a system for supplying a precursor material for an ALD process includes a gas supply for providing one or more precursor materials to a deposition chamber. The system also includes a gas circulation system coupled to an output line of the deposition chamber. The gas circulation system is configured to transport gas exiting the deposition chamber to an input line of the deposition chamber, where the gas circulation system causes the gas exiting the deposition chamber to be transported back into the deposition chamber. The system also includes a filter coupled to the gas circulation system, where the filter reduces contaminants in the gas being transported back into the deposition chamber. The system further includes a gas composition detection system coupled to the output line. The gas composition detection system is configured to produce an output signal indicating a composition of the gas exiting the deposition chamber. A purge gas delivery system is configured to deliver a purge gas to the deposition chamber via a plurality of purge lines. The system also includes a controller coupled to the gas supply, where the controller controls the providing of the one or more precursor materials to the deposition chamber.

In another example, in a method for supplying a precursor material for an ALD process, one or more precursor materials are provided to a deposition chamber. A composition of a gas exiting the deposition chamber is monitored. The gas exiting the deposition chamber is transported back into the deposition chamber via a circulation system. The providing of the one or more precursor materials and the transporting of the gas back into the deposition chamber are controlled based on the monitored composition of the gas exiting the deposition chamber.

DETAILED DESCRIPTION

Figure 1:
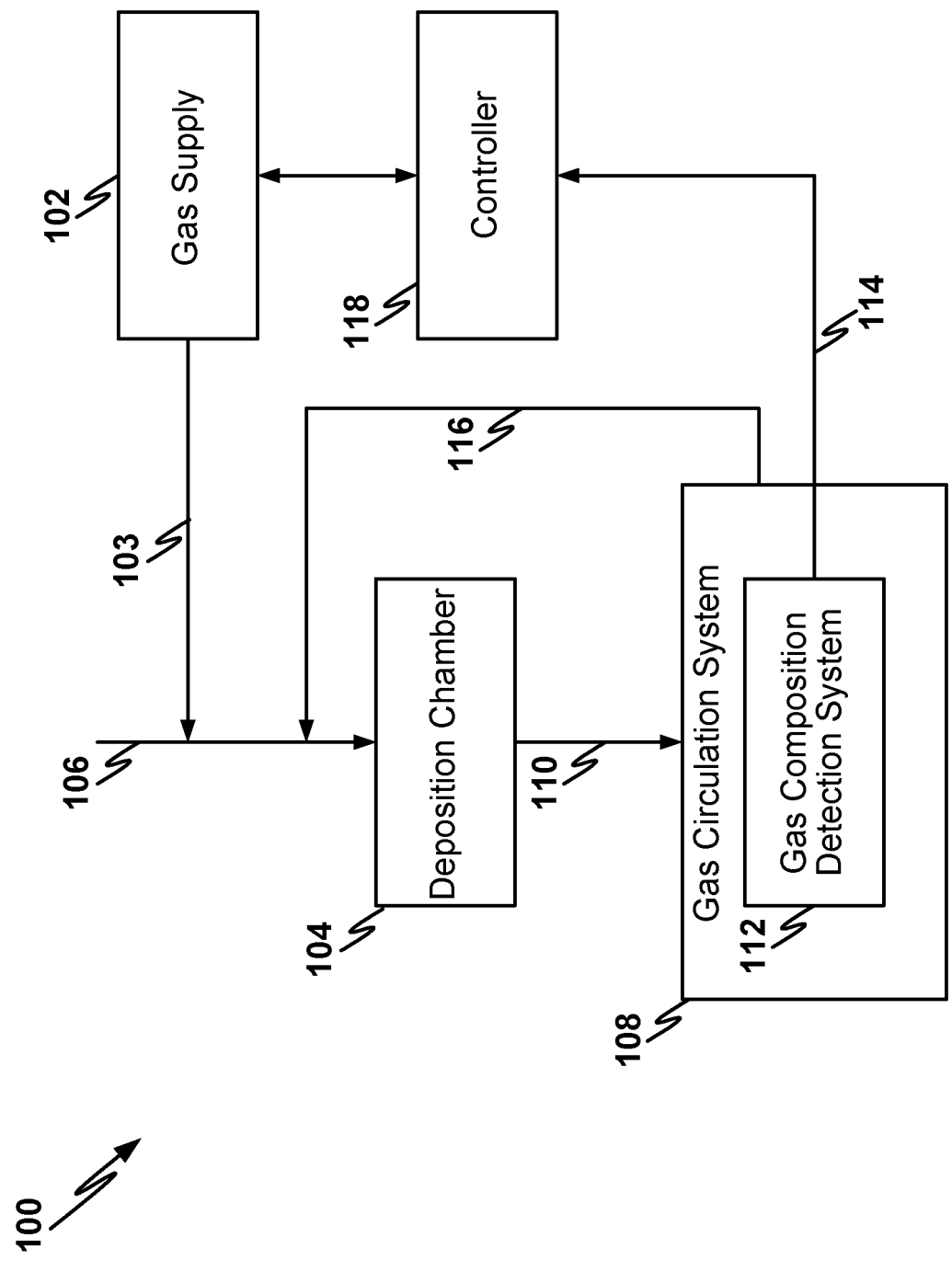
FIG. 1 depicts an example system for supplying a precursor material for an atomic layer deposition (ALD) process.

FIG. 1 depicts an example system 100 for supplying a precursor material for an atomic layer deposition (ALD) process. The example system 100 of FIG. 1 may include a gas supply 102 for supplying one or more precursor materials to a deposition chamber 104. In one example, the gas supply 102 may include a plurality of gas canisters, where the plurality of gas canisters may be used to supply different precursor materials used in the ALD process. The gas supply 102 may supply the one or more precursor materials to the deposition chamber 104 via an input line 106 of the deposition chamber. Although the input line 106 in the example of FIG. 1 is depicted as being open-ended, such that the input line 106 may be connected to various other external systems (e.g., pump systems, other gas supply systems, etc.), in other examples, the input line 106 may be connected directly to the gas supply 102, such that other external systems may not be connected to the input line 106. The gas supply 102 may supply the one or more precursor materials to the input line 106 via a supply line 103 that couples the input line 106 to the gas supply 102.

As described in further detail below with reference to FIG. 3, the deposition chamber 104 may include a mounting platform or other hardware on which a substrate may be placed. The example system 100 of FIG. 1 may be used to form one or more deposited layers on the substrate. The deposition chamber 104 may include an output line 110 that allows gases and other matter to exit the deposition chamber 104. The output line 110 may include, for example, an exhaust outlet that allows the gases and other matter to exit the deposition chamber 104. In some examples, a vacuum pump may be connected to the output line 110 in order to help evacuate the gases and other matter from the deposition chamber 104. Such a vacuum pump may also be utilized to reduce and control a pressure within the deposition chamber 104 to a desired pressure. The gases and other matter that exit the deposition chamber 104 may include the one or more precursor materials introduced to the deposition chamber 104 via the input line 106.

A gas circulation system 108 may be coupled to the output line 110 of the deposition chamber 104. The gas circulation system 108 may be used to reduce an amount of the one or more precursor materials that are used in the ALD process. For example, in conventional systems that do not utilize the gas circulation system 108, the one or more precursor materials may be evacuated from the deposition chamber 104 via the output line 110 and directed to an exhaust system (e.g., a typical exhaust system including a filtering system that is exhausted to the atmosphere). Such conventional systems may use a high amount of the one or more precursor materials because a large amount of the precursor materials may be discarded after exiting the deposition chamber 104. By contrast, the system 100 including the gas circulation system 108 may be used to lower precursor waste in ALD processes and thus also lower production costs.

The gas circulation system 108 may lower precursor waste by providing a circulation line 116 that may be coupled between the gas circulation system 108 and the input line 106. The circulation line 116 may be configured to transport the gas exiting the deposition chamber 104 to the input line 106, which may cause the gas exiting the deposition chamber 104 to be transported back into the deposition chamber 104. In this manner, by circulating precursor gases back into the deposition chamber, rather than directing them to an exhaust system to be discarded, the gas circulation system 108 may reduce precursor waste in the ALD system 100.

In addition to including the circulation line 116, the gas circulation system 108 coupled to the output line 110 of the deposition chamber 104 may also include a gas composition detection system 112. The gas composition detection system 112 may be configured to monitor the gas exiting the deposition chamber 104 and to produce an output signal indicating a composition of the gas. The gas composition detection system 112 may include one or more different monitoring components, including, for example, a Fourier transform infrared spectroscopy (FTIR) system, a nondispersive infrared sensor (NDIR) system, or a Piezocon gas concentration sensor (PZC) system. Various other types of gas composition monitoring systems may be used in the gas composition detection system 112.

The gas circulation system 108, and specifically, the gas composition detection system 112 included therein, may be coupled to a controller 118 via a connection 114 (e.g., electrical connection, optical connection, etc.). The controller 118 may also be coupled to the gas supply 102, as illustrated in the example of FIG. 1. The controller 118 may control the providing of the one or more precursor materials by the gas supply 102 to the deposition chamber 104. Specifically, the controller 118 may control the providing of the one or more precursor materials based on the output signal of the gas composition detection system 112, where the output signal may be provided to the controller 118 via the connection 114. Thus, for example, the controller 118 may receive the output signal of the gas composition detection system 112, where the output signal may indicate that a particular precursor material is not of an adequate amount in the gas exiting the deposition chamber 104. Based on this output signal, the controller 118 may control the gas supply 102 to cause more of the particular precursor material to enter the deposition chamber 104.

In this example, the gas composition detection system 112 may thus provide a feedback signal to the controller 118, such that a composition of the gas in the chamber 104 may be controlled. In other examples, the gas composition detection system 112 may not be connected to the controller 118, and in such examples, the controller 118 may be used to control the providing of the precursor materials to the chamber 104 without a feedback signal. In such systems where the gas composition detection system 112 is not connected to the controller 118, the gas composition detection system 112 may be used for other purposes. For example, the gas composition detection system 112 may be used to monitor the composition of the gas exiting the chamber 104 to determine if the gas should be transported back into the chamber 104 via the circulation line 116.

Figure 2:
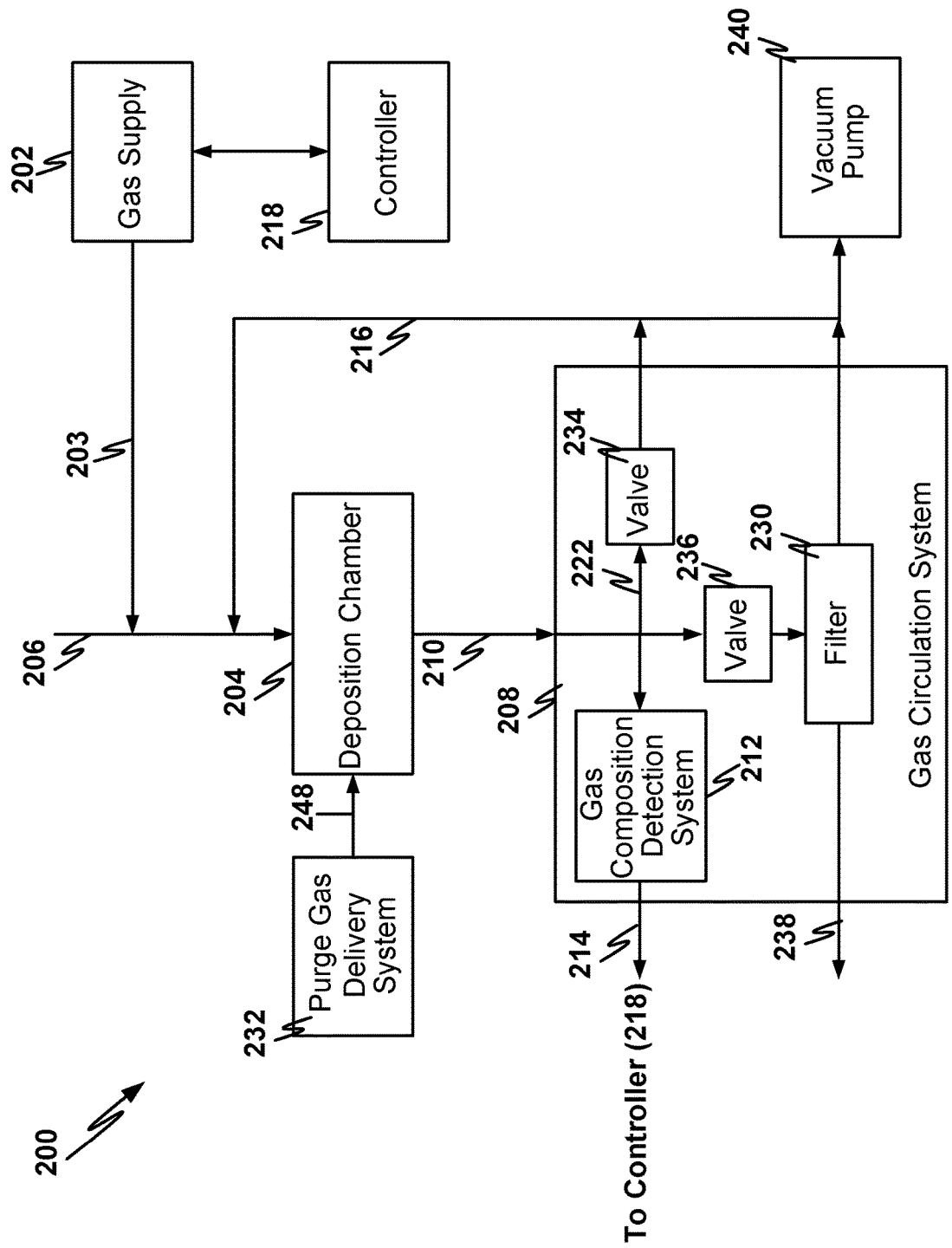
FIG. 2 depicts an example system for supplying a precursor material to a deposition chamber for an ALD process, where the example system may include a gas circulation system for causing gas exiting the deposition chamber to be transported back into the deposition chamber.

FIG. 2 depicts an example system 200 for supplying a precursor material to a deposition chamber 204 for an ALD process, where the example system 200 may include a gas circulation system 208 for causing gas exiting the deposition chamber 204 to be transported back into the deposition chamber 204. The example system 200 of FIG. 2 may include components similar to those included in the example system 100 of FIG. 1. For example, the example system 200 may include a gas supply 202 for supplying one or more precursor materials to a deposition chamber 204 via a supply line 203. The supply line 203 may be coupled to an input line 206 of the deposition chamber 204, such that the one or more precursor materials enter the chamber 204 via the input line 206. The deposition chamber 204 may include suitable hardware for holding a substrate and may also include an output line 210 that allows gases (e.g., the one or more precursor materials, purge gas, etc.) and other matter to exit the deposition chamber 204.

A gas circulation system 208 may be coupled to the output line 210 of the deposition chamber 204, where the gas circulation system 208 may be used to reduce an amount of the one or more precursor materials that are used in the ALD process. The gas circulation system 208 may lower precursor waste by providing a circulation line 216 that may be coupled between the gas circulation system 208 and the input line 206. The circulation line 216 may be configured to transport the gas exiting the deposition chamber 204 to the input line 206, which may cause the gas exiting the deposition chamber 204 to be transported back into the deposition chamber 204 through the input line 206.

The gas circulation system 208 may also include a gas composition detection system 212. The gas composition detection system 212 may be configured to monitor the gas exiting the deposition chamber 204 and to produce an output signal indicating a composition of the gas. The gas composition detection system 212 may be coupled to a controller 218 via a connection 214 (e.g., electrical connection, optical connection, etc.). The controller 218 may also be coupled to the gas supply 202 and may control the providing of the one or more precursor materials by the gas supply 202 to the deposition chamber 204. The controller 218 may control the providing of the one or more precursor materials based on the output signal of the gas composition detection system 212.

The gas circulation system 208 may further include a filter 230, where the filter 230 is configured to remove contaminants or particles from the gas exiting the deposition chamber 204. The removal of the contaminants or particles from the gas exiting the deposition chamber 204 by the filter 230 may occur prior to the transporting of the gas back into the deposition chamber 204 via the circulation line 216. The contaminants or particles removed by the filter 230 may be stored in the filter 230 or may be exhausted or otherwise discarded via a line 238 of the filter 230.

In some situations, it may be determined that the filter 230 is not necessary (e.g., the gas exiting the deposition chamber 204 is relatively particle-free). This determination may be made, for example, based on a signal produced by the gas composition detection system 212. The signal that may determine whether the filter 230 is necessary or unnecessary may be the output signal indicating the composition of the gas that is provided to the controller 218, or the signal may be a different signal generated by the gas composition detection system 212. In another example, the determination of whether to use the filter 230 may be a decision that is made manually by an operator of the system 200, or the determination may be made using a different (e.g., external) system or component (not depicted in the example of FIG. 2).

When the filter 230 is not to be used in removing the contaminants or particles from the gas exiting the deposition chamber 204, a bypass line 222 may be used. The bypass line 222 may allow the gas exiting the deposition chamber 204 to be transported back into the deposition chamber 204 (i.e., via the circulation line 216) without passing through the filter 230. The bypass line 222 may be enabled or disabled. When the bypass line 222 is enabled, the gas exiting the deposition chamber 204 may not pass through the filter 230, and when the bypass line 222 is disabled, the gas exiting the deposition chamber 204 may pass through the filter 230.

The bypass line 222 may be enabled and disabled by controlling valves 234 and 236. For example, when the valve 234 on the bypass line 222 is open, and the valve 236 is closed, the bypass line 222 may be enabled, such that the filter 230 is not used in circulating the gas back into the chamber 204. By contrast, when the valve 234 on the bypass line 222 is closed, and the valve 236 is open, the bypass line 222 may be disabled, such that the filter 230 is used to remove the contaminants or particles prior to circulating the gas back into the chamber 204. In another example, both of the valves 234 and 236 may be open, thus causing some of the gas exiting the chamber 204 to be filtered and some of the gas exiting the chamber 204 to not be filtered.

The controlling of the valves 234 and 236 may be based on an output signal produced by the gas composition detection system 212. For example, the gas composition detection system 212 may determine that the gas exiting the deposition chamber 204 is relatively particle-free and may produce an output signal that causes the valve 234 to be opened and the valve 236 to be closed, thus enabling the bypass line 222 and disabling use of the filter 230. Alternatively, the gas composition detection system 212 may determine that the gas exiting the deposition chamber 204 requires filtering and may produce an output signal that causes the valve 234 to be closed and the valve 236 to be opened, thus disabling the bypass line 222 and enabling use of the filter 230.

The example system 200 of FIG. 2 may further include a purge gas delivery system 232 that is coupled to the deposition chamber 204. The purge gas delivery system 232 may be used to deliver a purge gas to the deposition chamber 204 via one or more purge lines 248. The purge gas delivery system 232 may include a gaseous tank or other facility that provides a purge gas such as argon, nitrogen, xenon, or another non-reactive gas to the deposition chamber 204. In one example, a plurality of purge lines 248 are used to deliver the purge gas to the deposition chamber 204. Using the plurality of purge lines 248, as opposed to only a single purge line, a purging efficiency may be increased in the example system 200.

The delivery of the purge gas from the purge gas delivery system 232 may be used to maintain cleanliness in the deposition chamber 204 (e.g., to remove contaminants, particles, and other undesired matter from the deposition chamber 204) and to control a flow of gases in the deposition chamber 204. The controlling of the flow of gases may be used, for example, to remove precursor materials from the deposition chamber 204. For example, in an example ALD process where multiple precursor materials are used, a first precursor material may be introduced in the chamber 204 for a first amount of time. The purge gas delivery system 232 may be used to remove the first precursor material from the chamber 204 prior to an introduction of a second precursor material to the chamber 204.

A vacuum pump 240 may also be included in the example system 200 to apply a pressure differential to the deposition chamber 204 to aid in the removal of gases and other matter from the deposition chamber 204. Thus, the purge gas provided by the purge gas delivery system 232, along with the vacuum pump 240, may be used to purge precursor materials and other gases and matter from the deposition chamber 204. In one example, the purge gas delivery system 232 is controlled based on an output signal of the gas composition detection system 212. The output signal of the gas composition detection system 212 that controls the purge gas delivery system 232 may be, for example, the output signal indicating the composition of the gas exiting the deposition chamber 204 via the output line 210.

Figure 3:
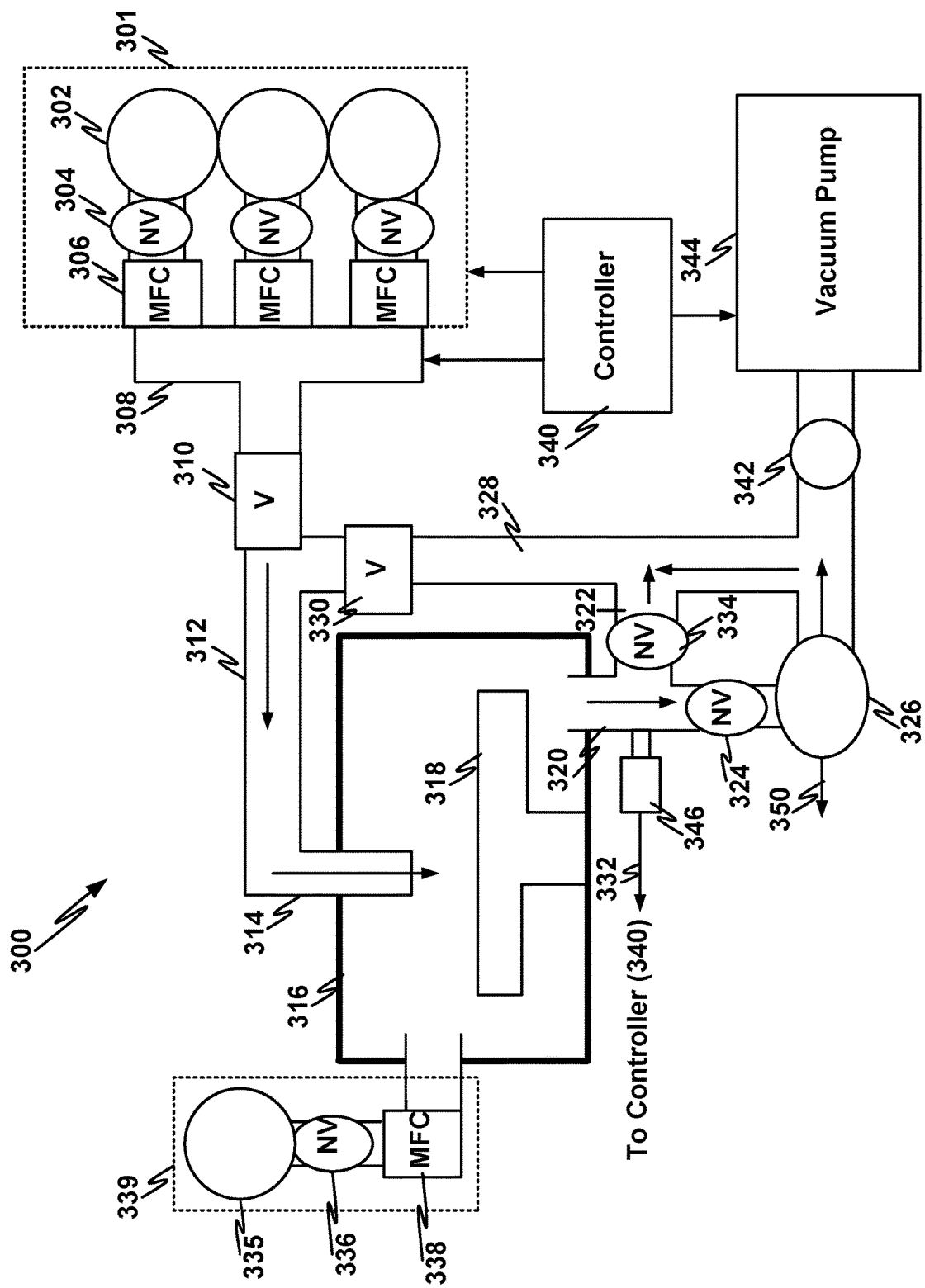
FIG. 3 depicts an example deposition system that may be used to form a deposited layer on a substrate or other structure.

FIG. 3 depicts an example deposition system 300 that may be used to form a deposited layer on a substrate or other structure. The deposited layer may be formed in the example system 300 of FIG. 3 using a deposition process such as atomic layer deposition (ALD). In the system 300, a deposition chamber 316 may receive precursor materials from a gas supply 301 via a supply line 312. The gas supply 301 may be used to deliver multiple precursor materials to the deposition chamber 316 and thus may be understood as including multiple different precursor delivery systems. In the example of FIG. 3, three different precursor materials may be delivered to the deposition chamber 316 from the gas supply 301, and the gas supply 301 may be understood as including three different precursor delivery systems. The three different precursor delivery systems may work in conjunction with one another to supply the various different precursor materials to the deposition chamber 316.

As illustrated in FIG. 3, each precursor delivery system may include a precursor material supplier 302, which may be a gas storage tank, canister, or a machine used to generate the precursor material on an as-needed basis (e.g., in one example where ozone is utilized as a precursor material, the precursor material supplier 302 may include a concentrator or other ozone generator that can generate ozone as needed).

Each precursor delivery system may further include a pneumatic valve 304 and a flow controller 306. The flow controller 306 may be utilized to control the flow of the precursor material to the deposition chamber 316 and may thereby help to control the pressure within the chamber 316. The flow controller 306 may be, for example, a proportional valve, a modulating valve, a needle valve, a pressure regulator, a mass flow controller, combinations of these, or the like.

In other examples, each precursor delivery system may further include a carrier gas supply, where the carrier gas supply may supply a gas that may be used to help carry the precursor gas to the deposition chamber 316. The carrier gas may be an inert gas or other gas that does not react with the precursor material or other materials within the deposition chamber 316. For example, the carrier gas may be helium (He), argon (Ar), nitrogen ($N_2$), hydrogen ($H_2$), combinations of these, or the like. In examples where the carrier gas supply is used, the carrier gas may enter the precursor material supplier 302 (e.g., the precursor canister) and carry the gaseous precursor material towards the deposition chamber 316.

The precursor delivery systems included in the gas supply 301 may be connected to a precursor gas controller 308. The precursor delivery systems may, using the precursor material suppliers 302, the pneumatic valves 304, and the flow controllers 306, supply their individual precursor materials to the precursor gas controller 308. The precursor gas controller 308 may connect and isolate the different precursor delivery systems from the deposition chamber 316 in order to allow delivery of a desired precursor material to the deposition chamber 316. The precursor gas controller 308 may include such devices as valves, flow meters, sensors, and the like to control the delivery rates of each of the precursors. As illustrated in FIG. 3, the precursor gas controller 308 may be coupled to a controller 340, and the precursor gas controller 308 may be controlled by instructions received from the controller 340. The gas supply 301 may also be coupled to the controller 340, and the controller 340 may control the providing of the precursor materials by the gas supply 301 by controlling the flow controllers 306 or other components of the gas supply 301.

The precursor gas controller 308, upon receiving instructions from the controller 340, may open and close valves so as to connect one of the precursor delivery systems to the deposition chamber 316 and direct a desired precursor material to the chamber 316 via the supply line 312. The supply line 312 may be coupled to an input line 314 of the deposition chamber 316, such that the deposition chamber 316 receives the desired precursor material via the input line 314. The deposition chamber 316 may expose the precursor materials to a substrate placed on mounting hardware 318 included in the deposition chamber 316. The deposition chamber 316 may be any desired shape that may be suitable for dispersing the precursor materials and contacting the precursor materials with the substrate. In one example, the deposition chamber 316 may have a cylindrical sidewall and a bottom and may be surrounded by a housing made of material that is inert to the various precursor materials (e.g., steel, stainless steel, nickel, aluminum, alloys of these, or other combinations of these).

The deposition chamber 316 may have an output line 320 to allow the precursor materials and other gases and matter to exit the deposition chamber 316. A vacuum pump 344 may be connected to the output line 320 of the deposition chamber 316 in order to help evacuate the precursor materials and the gases and other matter from the chamber 316.

The vacuum pump 344 may be under control of the controller 340 and may be utilized to reduce and control the pressure within the deposition chamber 316 to a desired pressure. A main valve 342 may be opened and closed as needed to allow the vacuum pump 344 to apply a pressure differential to the deposition chamber 316.

The evacuation of the precursor materials and the other gases and matter from the deposition chamber 316 may also be aided by a purge gas delivery system 339. The purge gas delivery system 339 may deliver a purge gas to the deposition chamber 316. The purge gas delivery system 339 may include a gas canister 335 or other component that can provide a purge gas such as argon (Ar), nitrogen ($N_2$), or another non-reactive gas to the deposition chamber 316. The purge gas delivery system may further include a pneumatic valve 336 and a flow controller 338 (e.g., a mass flow controller or another type of controller) and may be controlled by the controller 340. The purge gas delivery system 339 may deliver the purge gas to the deposition chamber 316 via a plurality of purge lines. By operating the plurality of purge lines simultaneously (e.g., in parallel), a purge efficiency of the purge gas delivery system 339 may be increased.

A gas circulation system may be coupled to the output line 320 of the deposition chamber 316, where the gas circulation system may be used to reduce an amount of precursor materials that are used in the deposition process. The gas circulation system may lower precursor waste by providing a circulation line 328 that may be coupled between the output line 320 and the input line 314 of the deposition chamber 316. The circulation line 328 may be configured to transport gas exiting the deposition chamber 316 to the input line 314, which may cause the gas exiting the deposition chamber 316 to be transported back into the deposition chamber 316 through the input line 314.

The circulation line 328 may include a circulation valve 330, where the circulation valve 330 may be configured to open and close the circulation line 328. When the circulation line 328 is opened by opening the circulation valve 330, the gas exiting the deposition chamber 316 may be transported back into the deposition chamber 316. When the circulation line 328 is closed by closing the circulation valve 330, the gas exiting the deposition chamber may not be transported back into the deposition chamber 316. When the circulation line 328 is closed in this manner, the gas exiting the chamber 316 may be evacuated out of the system 300 and transported to an exhaust system by way of the vacuum pump 344 or otherwise forced to exit the system 300 without being re-circulated through the chamber 316.

As noted above, the supply line 312 may be coupled to the input line 314 of the deposition chamber 316, such that the deposition chamber 316 may receive precursor materials via the input line 314. As depicted in FIG. 3, the supply line 312 may include a supply valve 310, where the supply valve 310 may be used to open and close the supply line 312. The circulation valve 330 and the supply valve 310 may be opened and closed to control a composition of a gas entering the deposition chamber 316 through the input line 314.

In one example, the opening and closing of the circulation valve 330 and the supply valve 310 may control i) an amount of the gas exiting the deposition chamber 316, and ii) an amount of the precursor materials from the gas supply 301 that are present in the gas entering the deposition chamber 316 through the input line 314. Thus, the circulation valve 330 and the supply valve 310 may be opened and closed to control a mixture of gases entering the deposition chamber 316 through the input line 314, where the mixture may include only the precursor materials from the gas supply 301, only the gas exiting the deposition chamber 316 via the output line 320, or a combination of the precursor materials from the gas supply 301 and the gas exiting the deposition chamber 316 via the output line 320.

The gas circulation system may also include a gas composition detection system 346. The gas composition detection system 346 may be configured to monitor the gas exiting the deposition chamber 316 and to produce an output signal indicating a composition of the gas. The output signal of the gas composition detection system 346 may be used to determine when gas exiting the deposition chamber 316 should be circulated back into the chamber 316 via the circulation line 328 and when the deposition chamber 316 should be purged via the purge gas delivery system 339. The gas composition detection system 346 may include one or more different monitoring components, including, for example, a Fourier transform infrared spectroscopy (FTIR) system, a nondispersive infrared sensor (NDIR) system, or a Piezocon gas concentration sensor (PZC) system. Various other types of gas composition monitoring systems may be used in the gas composition detection system 346.

The gas composition detection system 346 may be coupled to the controller 340 via a connection 332 (e.g., electrical connection, optical connection, etc.). As described above, the controller 340 may also be coupled to the gas supply 301 and the precursor gas controller 308. The controller 340 may control the providing of the precursor materials to the deposition chamber 316 by controlling the gas supply 301 or the precursor gas controller 308. The controller 340 may control the gas supply 301 or the precursor gas controller 308 based on the output signal from the gas composition detection system 346. Further, in another example, the circulation valve 330 and the supply valve 310 may be opened and closed based on the output signal from the gas composition detection system 346 (e.g., to control a mixture of gases entering the chamber 316 via the input line 314, where the mixture may include gases from the gas supply 301 and the gas exiting the chamber 316 via the output line 320).

The gas circulation system may further include a filter 326, where the filter 326 is configured to remove contaminants or particles from the gas exiting the deposition chamber 316. The removal of the contaminants or particles by the filter 326 may occur prior to the transporting of the gas back into the deposition chamber 316 via the circulation line 328. The contaminants or particles removed by the filter 326 may be stored in the filter 326 or may be exhausted or otherwise discarded via a line 350 of the filter 326.

If the filter 326 is determined to be unnecessary (e.g., where the determination may be made, for example, based on a signal produced by the gas composition detection system 346), a bypass line 322 may be used. The bypass line 322 may allow the gas exiting the deposition chamber 316 to be transported back into the deposition chamber 316 (i.e., via the circulation line 328) without passing through the filter 326. The bypass line 322 may be enabled or disabled by controlling valves 324 and 334. For example, when the valve 334 on the bypass line 322 is open, and the valve 324 is closed, the bypass line 322 may be enabled, such that the filter 326 is not used in circulating the gas back into the chamber 316. By contrast, when the valve 334 on the bypass line 322 is closed, and the valve 324 is open, the bypass line 322 may be disabled, such that the filter 326 is used to remove the contaminants or particles prior to circulating the gas back into the chamber 316. The controlling of the valves 324 and 334 may be based on an output signal produced by the gas composition detection system 346. The valves 324 and 334 may be, for example, pneumatic valves or other types of valves.

Figure 4:
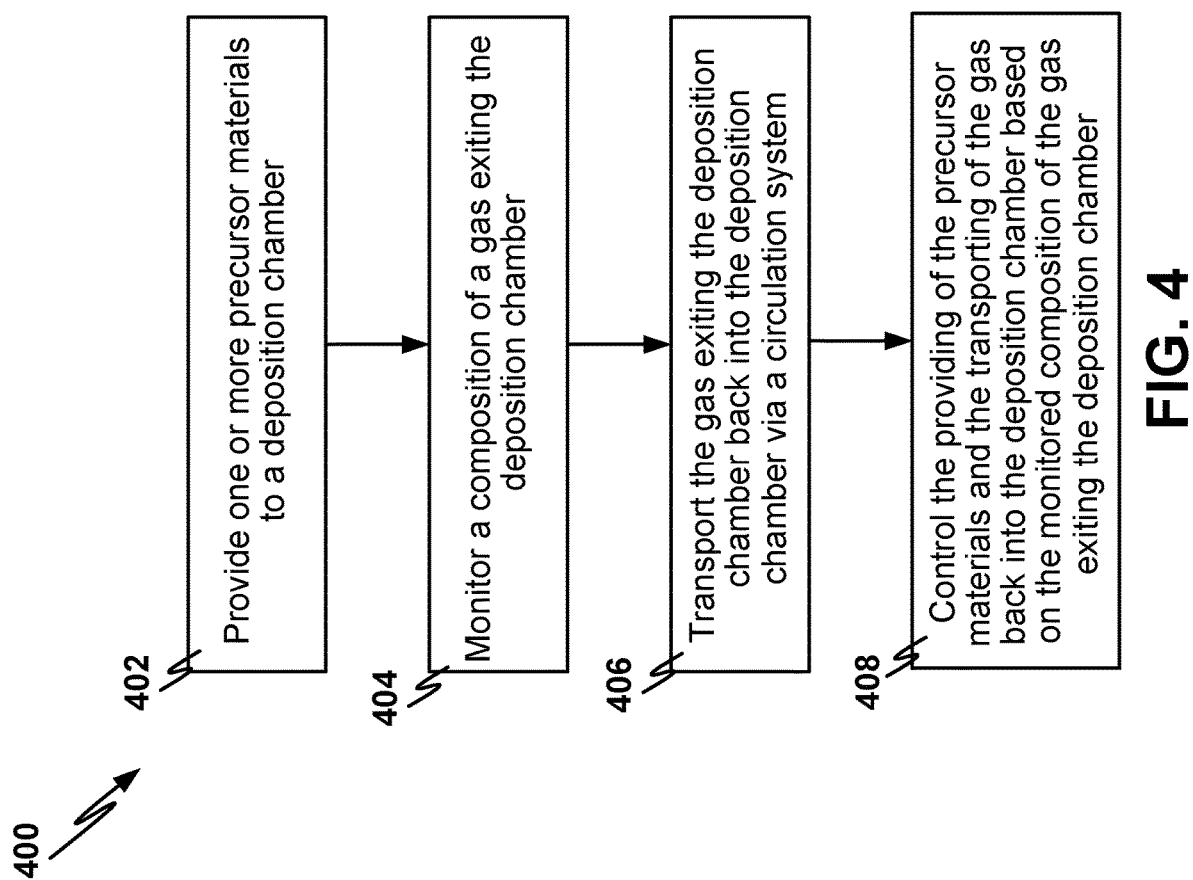
FIG. 4 is a flowchart illustrating an example method for supplying a precursor material for an ALD process.

FIG. 4 is a flowchart 400 illustrating an example method for supplying a precursor material for an atomic layer deposition (ALD) process. At 402, one or more precursor materials are provided to a deposition chamber. At 404, a composition of a gas exiting the deposition chamber is monitored. At 406, the gas exiting the deposition chamber is transported back into the deposition chamber via a circulation system. At 408, the providing of the one or more precursor materials and the transporting of the gas back into the deposition chamber are controlled based on the monitored composition of the gas exiting the deposition chamber.

This written description uses examples to disclose the disclosure, including the best mode, and also to enable a person skilled in the art to make and use the disclosure. The patentable scope of the disclosure may include other examples. It should be understood that as used in the description herein and throughout the claims that follow, the meaning of "a," "an," and "the" includes plural reference unless the context clearly dictates otherwise. Also, as used in the description herein and throughout the claims that follow, the meaning of "in" includes "in" and "on" unless the context clearly dictates otherwise. Further, as used in the description herein and throughout the claims that follow, the meaning of "each" does not require "each and every" unless the context clearly dictates otherwise. Finally, as used in the description herein and throughout the claims that follow, the meanings of "and" and "or" include both the conjunctive and disjunctive and may be used interchangeably unless the context expressly dictates otherwise; the phrase "exclusive of" may be used to indicate situations where only the disjunctive meaning may apply.

It is claimed:

1. A method for supplying a precursor material for an atomic layer deposition (ALD) process, the method comprising:
   providing a precursor material from a gas supply to a deposition chamber via an input line of the deposition chamber;
   producing an output signal, using a gas composition detection system of a gas circulation system coupled to an output line of the deposition chamber, indicating a composition of an exhaust gas exiting the deposition chamber through the output line,
   removing contaminants or particles from the exhaust gas, using a filter, prior to transporting of the exhaust gas back into the deposition chamber;
   allowing, using a bypass line, the exhaust gas to be transported back into the deposition chamber without passing through the filter;
   causing, via a circulation line coupled to the bypass line, the exhaust gas to be mixed with the precursor material and transported back into the deposition chamber; and
   controlling, using a controller coupled to the gas supply, (i) an amount of the precursor material being provided by the gas supply to the deposition chamber and (ii) an amount of the exhaust gas being transported by the gas circulation system back into the deposition chamber, based on the output signal, during deposition, wherein the controller is configured to close a first valve and open a second valve to cause the exhaust gas to flow through the filter based on the output signal of the gas composition detection system indicating filtering is not necessary, and to open the first valve and close the second valve to cause the exhaust gas to bypass the filter based on the output signal of the gas composition detection system indicating filtering is necessary; such that, while a mixture of the precursor material and a downstream portion of the exhaust gas is flowing into the deposition chamber, an upstream portion of the exhaust gas is being monitored by the gas composition detection system before being mixed with the precursor material.

2. The method of claim 1, wherein the bypass line is configured to be enabled and disabled, wherein the exhaust gas does not pass through the filter when the bypass line is enabled, and wherein the exhaust gas passes through the filter when the bypass line is disabled.

3. The method of claim 1, wherein the bypass line is enabled and disabled by controlling the first valve, and wherein the enabling and disabling of the bypass line is based on the output signal of the gas composition detection system, and wherein the system includes the first valve configured to control gas flow through the bypass line and the second valve configured to control gas flow to the filter.

4. The method of claim 1, further comprising
opening and closing the circulation line using a circulation valve of the gas circulation system;
wherein when the circulation line is opened by the circulation valve, the exhaust gas is transported back into the deposition chamber, and
wherein when the circulation line is closed by the circulation valve, the exhaust gas is not transported back into the deposition chamber.

5. The method of claim 4, further comprising:
transporting, via a supply line coupled to the gas supply and to the input line, the precursor material from the gas supply to the input line, wherein the supply line includes a supply valve, the supply valve is configured to open and close the supply line.

6. The method of claim 5, wherein the circulation valve and the supply valve are opened and closed to control a composition of a gas entering the deposition chamber through the input line, and wherein the circulation valve and the supply valve are opened and closed based on the output signal of the gas composition detection system.

7. The method of claim 1, further comprising:
delivering, using a purge gas delivery system, a purge gas to the deposition chamber via one or more purge lines.

8. The method of claim 7, wherein the purge gas delivery system is controlled based on the output signal of the gas composition detection system.

9. The method of claim 7, further comprising controlling, using the purge gas delivery system, a flow of gases in the deposition chamber.

10. The method of claim 7, further comprising delivering the purge gas to the deposition chamber via a plurality of purge lines.

11. The method of claim 10, wherein the plurality of purge lines are operated simultaneously.

12. The method of claim 1, wherein the gas composition detection system includes a Fourier transform infrared spectroscopy (FTIR) system, a nondispersive infrared sensor (NDIR) system, or a Piezocon gas concentration sensor (PZC) system.

13. The method of claim 1, further comprising controlling, using the controller, which of the plurality of gas sources is provided to the deposition chamber wherein the gas supply includes a plurality of gas sources.

14. The method of claim 1, further comprising:
controlling flow, using a circulation valve, of the exhaust gas to the deposition chamber's input line; and
controlling, using a supply valve, flow of supply gas to combine with the exhaust gas that has exited the circulation valve and is in the deposition chamber's input line.

15. The method of claim 1, further comprising:
controlling, using a precursor delivery system comprising a pneumatic valve and a flow controller, the flow of the precursor material to the deposition chamber.

16. A method for supplying a precursor material for an atomic layer deposition (ALD) process, the method system comprising:
providing, via a gas supply, one or more precursor materials to a deposition chamber;
transporting, via a gas circulation system coupled to an output line of the deposition, exhaust gas exiting the deposition chamber to an input line of the deposition chamber;
reducing, using a filter coupled to the gas circulation system, contaminants in the gas being transported back into the deposition chamber;
controlling, using a first valve, flow through the bypass line;
controlling, using a second valve, flow to the filter by closing the first valve and opening the second valve to cause the exhaust gas to flow through the filter;
producing, using a gas composition detection system coupled to the output line, an output signal indicating a composition of the exhaust gas exiting the deposition chamber;
controlling, during deposition using a controller coupled to the gas supply, (i) an amount of the one or more precursor materials being provided to the deposition chamber and (ii) and amount of the exhaust gas being transported back to the deposition chamber, based on the output signal of the gas composition detection system, wherein the controller is configured to close the first valve and open the second valve to cause the exhaust gas to flow through the filter based on the output signal of the gas composition detection system indicating filtering is not necessary, and to open the first valve and close the second valve to cause the exhaust gas to bypass the filter based on the output signal of the gas composition detection system indicating filtering is necessary.

17. A method for supplying a precursor material for an atomic layer deposition (ALD) process, the method comprising:
providing one or more precursor materials to a deposition chamber;
monitoring a composition of a gas exiting the deposition chamber;
transporting the gas exiting the deposition chamber back into the deposition chamber via a circulation system; and
controlling i) the providing of the one or more precursor materials, and ii) the transporting of the gas back into the deposition chamber based on the monitored composition of the gas exiting the deposition chamber.

18. The method of claim 17, further comprising:
delivering a purge gas to the deposition chamber via a plurality of purge lines, wherein the delivering is controlled based on the monitored composition of the gas exiting the deposition chamber.

19. The method of claim 17, further comprising:
producing an output signal, using a gas composition detection system of the circulation system coupled to an output line of the deposition chamber, indicating a composition of an exhaust gas exiting the deposition chamber through the output line.

20. The method of claim 17, wherein the controller is configured to close a first valve and open a second valve to cause the gas exiting the deposition chamber to flow through a filter based on an output signal of a gas composition detection system indicating filtering is not necessary, and to open the first valve and close the second valve to cause the gas exiting the deposition chamber to bypass the filter based on the output signal of the gas composition detection system indicating filtering is necessary: such that, while a mixture of the one or more precursor materials and a downstream portion of the gas exiting the deposition chamber is flowing into the deposition chamber, an upstream portion of the gas exiting the deposition chamber is being monitored by the gas composition detection system before being mixed with the one or more precursor materials.

* * * * *